United States Patent
Majhi et al.

(10) Patent No.: US 12,374,666 B2
(45) Date of Patent: Jul. 29, 2025

(54) INTEGRATED CIRCUIT ASSEMBLIES WITH STACKED COMPUTE LOGIC AND MEMORY DIES

(71) Applicant: Intel Corporation, Santa Clara, CA (US)

(72) Inventors: Prashant Majhi, San Jose, CA (US);
Brian S. Doyle, Portland, OR (US);
Abhishek A. Sharma, Hillsboro, OR (US); Van H. Le, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 860 days.

(21) Appl. No.: 17/382,575

(22) Filed: Jul. 22, 2021

(65) Prior Publication Data

US 2023/0022167 A1    Jan. 26, 2023

(51) Int. Cl.
*H01L 25/10*     (2006.01)
*H01L 23/00*     (2006.01)
(Continued)

(52) U.S. Cl.
CPC ...... *H01L 25/105* (2013.01); *H01L 23/49816* (2013.01); *H01L 23/49833* (2013.01);
(Continued)

(58) Field of Classification Search
CPC ............. H01L 25/105; H01L 23/49833; H01L 23/5386; H01L 2224/32145;
(Continued)

(56) References Cited

U.S. PATENT DOCUMENTS

2009/0070721 A1    3/2009   Solomon
2012/0250443 A1    10/2012  Saraswat et al.
(Continued)

FOREIGN PATENT DOCUMENTS

| CN | 111357108 A | 6/2020 |
|---|---|---|
| WO | 0075793 A1 | 12/2000 |
| WO | 2013095561 A1 | 6/2013 |

OTHER PUBLICATIONS

Extended European Search Report in EP Patent Application No. 22159586.1 dated Sep. 12, 2022, 13 pages.
(Continued)

*Primary Examiner* — Thanh Y. Tran
(74) *Attorney, Agent, or Firm* — Akona IP PC

(57) ABSTRACT

Integrated circuit (IC) assemblies with stacked compute logic and memory dies, and associated systems and methods, are disclosed. One example IC assembly includes a compute logic die and a stack of memory dies provided above and coupled to the compute logic die, where one or more of the memory dies closest to the compute logic die include memory cells with transistors that are thin-film transistors (TFTs), while one or more of the memory dies further away from the compute logic die include memory cells with non-TFT transistors. Another example IC assembly includes a similar stack of compute logic die and memory dies where one or more of the memory dies closest to the compute logic die include static random-access memory (SRAM) cells, while one or more of the memory dies further away from the compute logic die include memory cells of other memory types.

20 Claims, 9 Drawing Sheets

(51) Int. Cl.
*H01L 23/498* (2006.01)
*H01L 23/538* (2006.01)
*H01L 25/00* (2006.01)
*H10D 30/67* (2025.01)

(52) U.S. Cl.
CPC .... *H01L 23/49838* (2013.01); *H01L 23/5385* (2013.01); *H01L 23/5386* (2013.01); *H01L 24/16* (2013.01); *H01L 24/32* (2013.01); *H01L 25/50* (2013.01); *H10D 30/6757* (2025.01); *H01L 2224/16147* (2013.01); *H01L 2224/16237* (2013.01); *H01L 2224/32145* (2013.01); *H01L 2225/1023* (2013.01); *H01L 2225/1058* (2013.01); *H01L 2225/1094* (2013.01); *H01L 2924/1431* (2013.01); *H01L 2924/1436* (2013.01); *H01L 2924/1437* (2013.01); *H01L 2924/1443* (2013.01); *H01L 2924/182* (2013.01)

(58) Field of Classification Search
CPC ..... H01L 2924/1431; H01L 2924/1436; H01L 2924/1437; H01L 24/08; H01L 2224/08145; H01L 2224/16145; H01L 2224/80895; H10D 30/6757; H10B 12/50
See application file for complete search history.

(56) References Cited

U.S. PATENT DOCUMENTS

| | | |
|---|---|---|
| 2020/0328186 A1 | 10/2020 | Liu |
| 2020/0411078 A1 | 12/2020 | Sharma et al. |
| 2021/0151438 A1 | 5/2021 | Gomes et al. |
| 2021/0375873 A1 | 12/2021 | Majhi et al. |
| 2022/0173090 A1* | 6/2022 | Gomes ................ H01L 23/5384 |

OTHER PUBLICATIONS

Chen, T., et al., "Mechanism of a-IGZO TFT Device Deterioration—Illumination Light Wavelength and Substrate Temperature Effects," J. Phys. D: Appl. Phys.; 7 pages (2017).

Gandhi, J., et al., "2.5D FPGA-HBM Integration Challenges," Gandhi Presentation, Xilinx, Inc., San Jose, CA; 25 pages (2017).

\* cited by examiner

INTEGRATED CIRCUIT ASSEMBLIES WITH STACKED COMPUTE LOGIC AND MEMORY DIES

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each IC die and each IC assembly or package that includes one or more dies becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
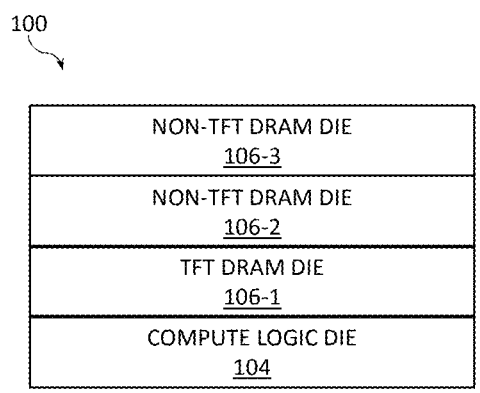
FIG. 1 provides a block diagram of an IC assembly with stacked compute logic and memory dies, according to some embodiments of the present disclosure.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating IC assemblies with stacked compute logic and memory dies as described herein, it might be useful to first understand phenomena that may come into play in certain IC arrangements. The following foundational information may be viewed as a basis from which the present disclosure may be properly explained. Such information is offered for purposes of explanation only and, accordingly, should not be construed in any way to limit the broad scope of the present disclosure and its potential applications.

For future high-performance systems, there is an increasing desire to integrate memory dies (i.e., dies that include ICs comprising include memory cells) that are tightly coupled with high-performance compute logic dies (i.e., dies that include ICs comprising compute logic configured as central processing units (CPUs), graphics processing units (GPU), neural processing units (NPU), etc., together generally referred to as "XPUs"). Conventionally, compute logic dies and stacks of one or more memory dies are individually coupled to a package substrate for mechanical stability and to facilitate connection to each other and to other components, such as circuit boards. Such conventional approaches are sometimes referred to as 2.5-dimensional (2.5D) integration of logic and memory ("2.5D" because the memory dies may be arranged in a stack, resulting in 3-dimensional (3D) integration, while the compute logic dies are not in a stack with the memory dies but are coupled to the package substrate on their own, resulting in their 2-dimensional (2D) integration with the memory dies). The 2.5D integration of compute logic and memory dies may not be suitable in some implementations because the interconnect pitch achievable by 2.5D integration approaches may be limited (e.g., constrained by manufacturing, materials, and thermal considerations, among others). Therefore, full 3D integration of compute logic and memory dies may seem like a good alternative. However, when more than one memory dies are stacked above a compute logic die, the memory dies closest to the compute logic die have less efficient cooling paths than the memory dies further away from the compute logic die, resulting in the memory dies closest to the compute logic die being at higher temperatures during operation. Higher temperatures cause a variety of thermal issues in the memory dies (e.g., increase transistor leakage), which, in turn, result in increased refresh rates and energy consumption. Thus, 3D integration of compute logic and memory dies may seem to be commercially feasible for compute logic dies being relatively low-performance dies and/or for only a few (typically just one) memory die being stacked over a compute logic die.

Embodiments of the present disclosure provide IC assemblies with stacked compute logic and memory dies, and associated systems and methods, to improve on thermal issues associated with 3D integration of compute logic and memory dies while achieving desired bandwidth/performance of the assemblies.

In one aspect of the present disclosure, an example IC assembly includes a compute logic die and a stack of memory dies provided above and coupled to the compute logic die (i.e., the compute logic die and the memory dies are arranged according to 3D integration), where one or more of the memory dies closest to the compute logic die include memory cells with transistors that are thin-film transistors (TFTs) (i.e., transistors with channel materials being thin-film semiconductor materials), while one or more of the memory dies further away from the compute logic die include memory cells with non-TFT transistors (i.e., transistors with channel materials being not thin-film semiconductor materials, e.g., being epitaxially grown semiconductor materials). Thin-film semiconductor materials typically have larger bandgaps and, therefore, are less temperature sensitive, than epitaxially grown semiconductor materials. As a result, even though, during operation, the temperature of memory dies with TFT-based memory cells may be higher than the temperature of memory dies with non-TFT-based memory cells because the former dies are closer to the compute logic die, the higher temperatures may be acceptable because TFT channel materials are less temperature sensitive, thus providing improvements in terms of addressing thermal issues of die stacks. At the same time, memory dies with non-TFT-based memory cells typically have higher bandwidth/performance than memory dies with TFT-based memory cells. Thus, including one or more memory dies with non-TFT-based memory cells in a die stack above a compute logic die allows increasing the overall bandwidth/performance of the die stack compared to, e.g., a die stack that included only memory dies with TFT-based memory cells.

In another aspect of the present disclosure, an example IC assembly includes a compute logic die and a stack of memory dies provided above and coupled to the compute logic die (i.e., the compute logic die and the memory dies are arranged according to 3D integration), where one or more of the memory dies closest to the compute logic die include static random-access memory (SRAM) cells, while one or more of the memory dies further away from the compute logic die include memory cells of other types, such as dynamic random-access memory (DRAM), resistive switching memory (e.g., magnetoresistive random-access memory (MRAM) or resistive random-access memory (RRAM)), spin-transfer torque random-access memory (STTRAM) cells, etc. SRAM typically requires larger number of interconnects (pins) to couple to another die or a package substrate, compared to other memory types. At the same time, SRAM is often characteristically faster (i.e., lower latency) than other memory types. Therefore, including one or more SRAM dies closer to the compute logic die than memory dies of other memory types allows realizing the large number of interconnects and take advantage of the low latency of SRAM in the most efficient manner.

Although descriptions of the present disclosure may refer to compute logic devices (e.g., implemented using frontend transistors, referred to herein as logic transistors) or memory cells included in a given die of an IC assembly, any of the dies described herein may also include other types of devices. For example, in some embodiments, any of the memory dies described herein may also include logic transistors, and/or any of the compute logic dies described herein may also include memory cells. Furthermore, some embodiments of the present disclosure may refer to DRAM and/or SRAM because these types of memory have been introduced in the past to address the limitation in density and standby power of other types or memory. However, embodiments of the present disclosure are equally applicable to memory dies with arrays of memory cells implemented using other technologies.

In the following detailed description, various aspects of the illustrative implementations will be described using terms commonly employed by those skilled in the art to convey the substance of their work to others skilled in the art.

For example, unless described otherwise, dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of input/output (I/O) functions, arithmetic operations, pipelining of data, etc.). The term "circuit" may be used to describe one or more passive and/or active components that are arranged to cooperate with one another to provide a desired function.

In other example, the term "interconnect" may be used to describe any element formed of an electrically conductive material for providing electrical connectivity to one or more components associated with an IC or/and between various such components. In context of an IC die/chip, the term "interconnect" may refer to both conductive lines/wires (also sometimes referred to as "lines" or "metal lines" or "trenches") and conductive vias (also sometimes referred to as "vias" or "metal vias"). In general, a term "conductive line" may be used to describe an electrically conductive element isolated by a dielectric material typically comprising an interlayer low-k dielectric that is provided within the plane of the IC die/chip. Such conductive lines are typically arranged in several levels, or several layers, of metallization stacks. On the other hand, the term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in not adjacent levels. A term "metallization stack" may be used to refer to a stack of one or more interconnects for providing connectivity to different circuit components of an IC die/chip. Sometimes, metal lines and vias may be referred to as "conductive lines/traces" and "conductive vias", respectively, to highlight the fact that these elements include electrically conductive materials such as, but not limited to, metals. On the other hand, in context of a stack of dies coupled to one another or in context of a die coupled to a package substate, the term "interconnect" may refer to, respectively, to die-to-die (DTD) interconnects and die-to-package substrate (DTPS) interconnects.

In various embodiments, components associated with an IC (i.e., IC components) may include, for example, transistors, diodes, power sources, resistors, capacitors, inductors, sensors, transceivers, receivers, antennas, etc. In various embodiments, components associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed as part of a chipset for executing one or more related functions in a computer.

As used herein, the terms "die" and "IC die" are synonymous, as are the terms "component" and "IC component," the terms "circuit" and "IC circuit," or the terms "package" and "IC package." The term "insulating" means "electrically insulating," the term "conducting" means "electrically conducting," unless otherwise specified. Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. A first component described to be electrically coupled to a second component means that the first component is in conductive contact with the second component (i.e., that a conductive pathway is provided to route electrical signals/power between the first and second components). The terms "oxide," "carbide," "nitride," etc. refer to compounds containing, respectively, oxygen, carbon, nitrogen, etc.; the term "high-k dielectric" refers to a material having a higher dielectric constant than silicon oxide; the term "low-k dielectric" refers to a material having a lower dielectric constant than silicon oxide.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. Although certain elements may be referred to in the singular herein, such elements may include multiple sub-elements. For example, "an electrically conductive material" may include one or more electrically conductive materials. In another example, a "dielectric material" may include one or more dielectric materials.

The description uses phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 3A-3C, such a collection may be referred to herein without the letters, e.g., as "FIG. 3." In order to not clutter the drawings, sometimes only one instance of a given element is labeled in a drawing with a reference numeral, although other similar elements may be shown.

In the drawings, some schematic illustrations of example structures of various devices and assemblies described herein may be shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Furthermore, although a certain number of a given element may be illustrated in some of the drawings (e.g., a certain number and type of memory dies and/or compute dies of IC assemblies illustrated in some drawings, or a certain number of power vias, signal vias, DTD interconnects, and DTPS interconnects illustrated in other drawings, etc.), this is simply for ease of illustration, and more, or less, than that number may be included in IC assemblies and related devices/packages according to various embodiments of the present disclosure. Still further, various views shown in some of the drawings are intended to show relative arrangements of various elements therein. In other embodiments, various IC assemblies with stacked compute logic and memory dies, as described herein, and related devices/packages, or portions thereof, may include other elements or components that are not illustrated (e.g., transistor portions, various components that may be in electrical contact with any of the illustrated components of the IC assemblies and related devices/packages, etc.). Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., physical failure analysis (PFA) would allow determination of presence of one or more IC assemblies with stacked compute logic and memory dies and related devices/packages as described herein.

FIG. 1 provides a block diagram of an IC assembly 100 with stacked compute logic die 104 and a plurality of memory dies 106, according to some embodiments of the present disclosure. The IC assembly 100 is illustrated with 3 memory dies 106, labeled as memory dies 106-1, 106-2, and 106-3, but, in various embodiments, the IC assembly 100 may include any number of two or more such memory dies 106. The memory dies 106 may be stacked over the compute logic die 104 in a 3D integration arrangement so that the first memory die 106-1 is coupled to the compute logic die 104, the second memory die 106-2 is coupled to the first memory die 106-1, the third memory die 106-3 is coupled to the second memory die 106-2, and so on. Thus, the first memory die 106-1 is stacked between the compute logic die 104 and the second memory die 106-2, the second memory die 106-2 is stacked between the first memory die 106-1 and the third memory die 106-3, and so on. In some embodiments, a thickness of an individual die of the plurality of dies 104, 106 of the IC assembly 100 may be between about 1 and 75 micrometers (micron), e.g., between about 2 and 50 micron. Including dies with thicknesses in this range may be advantageous in terms of better thermal conductivity across dies and reduced parasitic effects for the connections (e.g., smaller capacitance and resistance for interconnects that may extend through the dies).

The compute logic die 104 may include a plurality of logic transistors, some of which may be part of a control circuit to control (e.g., access (read/write), store, refresh) any of the memory dies 106. In some embodiments, some or all of such logic transistors may be front end of line (FEOL) transistors (also sometimes referred to as "frontend transistors"), e.g., fin-based transistors, nanoribbon/nanowire/nanosheet transistors, or FEOL transistors of any other architectures. In some embodiments, the logic transistors of the compute logic die 104 may be implemented as described below with reference to the transistors 2140.

For the IC assembly 100 shown in FIG. 1, each of the memory dies 106 may be a DRAM die, e.g., a memory die that includes DRAM cells. As an example, a DRAM cell may include a capacitor for storing a bit value, or a memory state (e.g., logical "1" or "0") of the cell, and an access transistor controlling access to the cell (e.g., access to write information to the cell or access to read information from the cell). Such a memory cell may be referred to as a "1T-1C memory cell," highlighting the fact that it uses one transistor (i.e., "1T" in the term "1T-1C memory cell") and one capacitor (i.e., "1C" in the term "1T-1C memory cell"). The capacitor of a 1T-1C memory cell may be coupled to one source or drain (S/D) region of the access transistor (e.g., to the source region of the access transistor), while the other S/D region of the access transistor (e.g., to the drain region) may be coupled to a bit-line (BL), and a gate terminal of the transistor may be coupled to a word-line (WL). Since such a memory cell can be fabricated with as little as a single access transistor, it can provide higher density and lower standby power versus some other types of memory in the same process technology.

Figure 2:
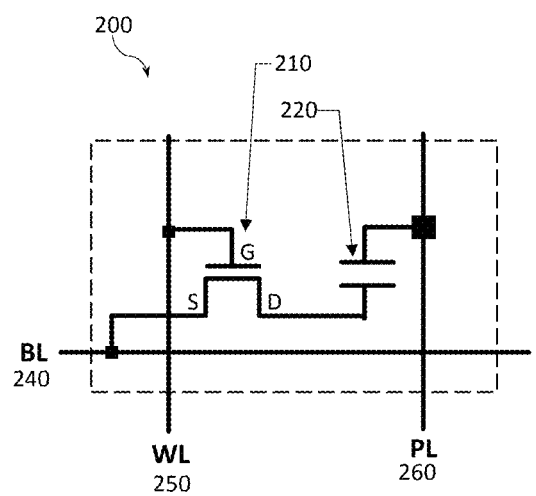
FIG. 2 provides an electric circuit diagram of an 1T-1C memory cell, according to some embodiments of the present disclosure.

FIG. 2 provides an electric circuit diagram of an 1T-1C memory cell 200, according to some embodiments of the present disclosure. A plurality of the memory cells 200 may be provided on any of the memory dies 106 that are implemented as DRAM dies, e.g., on any of the memory dies 106 shown in FIG. 1.

As shown in FIG. 2, the 1T-1C cell 200 may include an access transistor 210 and a storage element in the form of a capacitor 220. The access transistor 210 has a gate terminal, a source terminal, and a drain terminal, indicated in the example of FIG. 2 as terminals G, S, and D, respectively. In the following, the terms "terminal" and "electrode/contact" may be used interchangeably. Furthermore, for S/D terminals, the terms "terminal" and "region" may be used interchangeably.

As shown in FIG. 2, in the 1T-1C cell 200, the gate terminal of the access transistor 210 may be coupled to a WL 250, one of the S/D terminals of the access transistor 210 may be coupled to a BL 240, and the other one of the S/D terminals of the access transistor 210 may be coupled to a first electrode of the capacitor 220. As also shown in FIG. 2, the other electrode of the capacitor 220 may be coupled to a capacitor plate-line (PL) 260 (also sometimes referred to as a "select-line" (SL)). As is known in the art, WL, BL, and PL may be used together to read and program the capacitor 220. Each of the BL 240, the WL 250, and the PL 260, as well as intermediate elements coupling these lines to various terminals described herein, may be formed of any suitable electrically conductive material, which may include an alloy or a stack of multiple electrically conductive materials. In various embodiments, such electrically conductive materials may include one or more metals or metal alloys, with metals such as copper, aluminum, ruthenium, palladium, platinum, cobalt, nickel, hafnium, zirconium, titanium, and tantalum, and/or one or more oxides or carbides of such metals or metal alloys.

In some embodiments, the access transistor 210 may be a TFT. A plurality of the memory cells 200 where the access transistor 210 is a TFT may be provided in the TFT DRAM die 106-1, shown in FIG. 1. In other embodiments, the access transistor 210 may be not a TFT, e.g., a transistor formed based on an epitaxially grown semiconductor material. For example, in some such embodiments, the access transistor 210 may be a FinFET, a nanowire, or a nanoribbon transistor. A plurality of the memory cells 200 where the access transistor 210 is not a TFT may be provided in the non-TFT DRAM die 106-2 or the non-TFT DRAM die 106-3, shown in FIG. 1.

Non-TFT-based memory cells may be particularly suitable if it is desirable to have the transistors of the memory cells with channel regions formed of substantially single-crystalline semiconductor materials, in which case the semiconductor materials of the channel materials are epitaxially grown. On the other hand, in TFT-based memory cells, the semiconductor materials of the channel materials are deposited, as opposed to being epitaxially grown, in which case the channel regions may include polycrystalline, polymorphous, or amorphous semiconductor materials, or various other thin-film channel materials. Whether a semiconductor material of a channel region for a given transistor (e.g., an access transistor of a memory cell, e.g., the access transistor 210) has been epitaxially grown or deposited can be identified by inspecting grain size of the material. An average grain size of a semiconductor material in a channel region of a transistor being between about 0.05 and 1 millimeters (in which case the material may be considered to be polycrystalline) or smaller than about 0.05 millimeter (in which case the material may be considered to be polymorphous) may be indicative of the semiconductor material having been deposited, in which case the transistor is a TFT. On the other hand, an average grain size of the semiconductor material being equal to or greater than about 1 millimeter (in which case the material may be considered to be a single-crystal material) may be indicative of the semiconductor material having been epitaxially grown (which, in general, is a process performed at substantially higher temperatures than those at which thin-film semiconductor materials may be deposited for TFTs).

For any of the TFTs described herein, a channel region may be composed of semiconductor material systems including, for example, N-type or P-type materials systems. In some embodiments, the channel region of a TFT may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the channel region of a TFT may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In particular, the channel region of a TFT may be a thin-film material. Some such materials may be deposited at relatively low temperatures, which allows depositing them within the thermal budgets imposed on back end fabrication to avoid damaging the frontend components. In some embodiments, the channel region of a TFT may have a thickness between about 5 and 75 nanometers, including all values and ranges therein.

For any of the transistors that are not TFTs described herein, a channel region may be composed of semiconductor material systems including, for example, N-type or P-type materials systems. In some embodiments, the channel region of a non-TFT may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel region of a non-TFT may include a combination of semiconductor materials. In some embodiments, the channel region of a non-TFT may include a monocrystalline semiconductor, such as silicon (Si) or germanium (Ge). In some embodiments, the channel region of a non-TFT may include a compound semiconductor with a first sub-lattice of at least one element from group III of the periodic table (e.g., Al, Ga, In), and a second sub-lattice of at least one element of group V of the periodic table (e.g., P, As, Sb). For some example N-type transistor embodiments (i.e., for the embodiments where the transistor is an N-type metal-oxide-semiconductor (NMOS) transistor), the channel region may advantageously include a III-V material having a high electron mobility, such as, but not limited to InGaAs, InP, InSb, and InAs. For some such embodiments, the channel region may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel region of a non-TFT may be an intrinsic III-V material, i.e., a Ill-V semiconductor material not intentionally doped with any electrically active impurity. In alternate embodiments, a nominal impurity dopant level may be present within the channel region, for example to further fine-tune a threshold voltage Vt of the transistor, to provide HALO pocket implants, etc. Even for impurity-doped embodiments however, impurity dopant level within the channel region may be relatively low, for example below $10^{15}$ dopant atoms per cubic centimeter ($cm^{-3}$), and advantageously below $10^{13}$ $cm^{-3}$. For some example P-type transistor embodiments (i.e., for the embodiments where the transistor is a P-type metal-oxide-semiconductor (PMOS) transistor), the channel region may advantageously be a group IV material having a high hole mobility, such as, but not limited to Ge or a Ge-rich SiGe alloy. For some example embodiments, the channel region may have a Ge content between 0.6 and 0.9, and advantageously may be at least 0.7. In some embodiments with highest mobility, the channel region may be intrinsic III-V (or IV for P-type devices) material and not intentionally doped with any electrically active impurity. In alternate embodiments, one or more a nominal impurity dopant level may be present within the channel region, for example to further set a threshold voltage (Vt), or to provide HALO pocket implants, etc. Even for impurity-doped embodiments however, impurity dopant level within the channel region is relatively low, for example below $10^{15}$ $cm^{-3}$, and advantageously below $10^{13}$ $cm^{-3}$.

Thin-film semiconductor materials typically have larger bandgaps and, therefore, are less temperature sensitive, than epitaxially grown semiconductor materials. Therefore, in some embodiments, channel regions of the transistors of the TFT-based memory cells (e.g., of the TFT DRAM die 106-1 of FIG. 1) include a first semiconductor material, channel regions of the transistors of the non-TFT memory cells include a second semiconductor material (e.g., of the non-TFT DRAM dies 106-2 and 106-3 of FIG. 1), and a bandgap of the first semiconductor material is larger than a bandgap of the second semiconductor material.

Although not specifically shown in the present drawings, in general, implementations of the present disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. In some embodiments, the substrate may be non-crystalline. In some embodiments, the substrate may be a printed circuit board (PCB) substrate. Although a few examples of materials from which the substrate may be formed are described here, any material that may serve as a foundation upon which the logic transistors (e.g., frontend transistors) of the compute logic die 104 or memory cells (e.g., DRAM or SRAM cells) of the memory dies 106 may be built falls within the spirit and scope of the present disclosure. In some embodiments, the memory cell 200 or any other memory cells described herein may be provided over a support structure that includes a semiconductor substrate as described above. In other embodiments, the support structure over which any of the memory devices described herein may be provided may be a support structure of a non-semiconductor material.

Including one or more dies with TFT-based memory dies (e.g., the TFT DRAM die 106-1 as shown in FIG. 1) closer to the compute logic die 104 than one or more dies with non-TFT-based memory dies (e.g., the non-TFT DRAM dies 106-2 and 106-3 as shown in FIG. 1) may be advantageous in terms of addressing thermal challenges of die stacks while achieving target bandwidth/performance of the die stacks. Although the IC assembly 100 of FIG. 1 is illustrated as including DRAM dies, in general, descriptions provided with respect to FIG. 1 are equally applicable if the memory dies 106 are any memory dies that include at least a transistor and a storage element coupled to the transistor, where the transistors of the memory cells of the TFT die 106-1 of FIG. 1 are TFTs while the transistors of the memory cells of the dies 106-2 and 106-3 of FIG. 1 are non-TFTs. For example, in some embodiments of the IC assembly 100, the TFT die 106-1 may be a TFT SRAM die.

In general, the different dies 104, 106 may include any other suitable circuitry besides logic transistors and memory cells, respectively. For example, in some embodiments, the compute logic die 104-1 may include one or more of I/O circuitry, power delivery circuitry, a field programmable gate array logic, etc. In another example, in some embodiments, any of the memory dies 106 may also include a power delivery circuitry. Some of the memory dies 106 may include high-bandwidth memory devices, while other memory dies 106 may include low-bandwidth memory devices.

Figure 3:
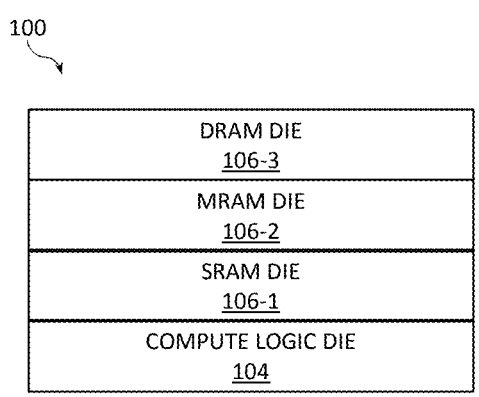
FIG. 3 provides a block diagram of an IC assembly with stacked compute logic and memory dies, according to other embodiments of the present disclosure.

FIG. 3 provides a block diagram of an IC assembly 100 with stacked compute logic die 104 and a plurality of memory dies 106, according to other embodiments of the present disclosure. The illustration of FIG. 3 differs from that of FIG. 1 in that the memory dies 106 are dies implementing different types of memory. In particular, the memory die 106-1 is an SRAM die, while the other dies 106 in the stack may be MRAM and DRAM dies, as shown in FIG. 3. Including one or more dies with SRAM cells (e.g., the SRAM DRAM die 106-1 as shown in FIG. 3) closer to the compute logic die 104 than one or more dies with non-SRAM cells (e.g., the MRAM die 106-2 and the DRAM die 106-3 as shown in FIG. 3) may be advantageous in terms of addressing thermal challenges of die stacks while achieving target bandwidth/performance of the die stacks. Other descriptions of the IC assembly 100 provided with reference to FIG. 1 are applicable to the IC assembly 100 shown in FIG. 3, and, therefore, in the interests of brevity, are not repeated. In other embodiments of the IC assembly 100 of FIG. 3, designation of MRAM and DRAM dies shown in FIG. 3 may be reversed and/or the memory dies 106-2 and 106-3 may include any other types of memories other than SRAM. Various architectures for SRAM, MRAM, and other types of memories are known in the art, all of which being within the scope of the present disclosure.

Figure 4A:
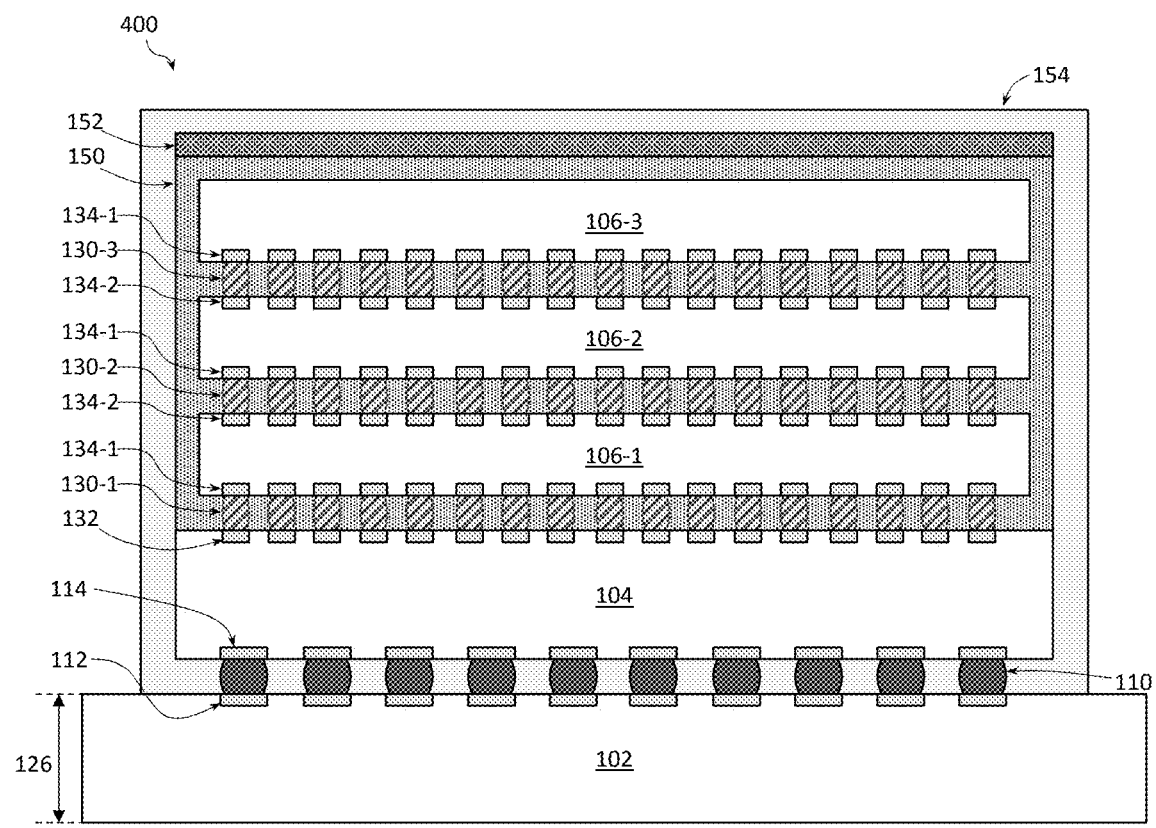
FIGS. 4A-4C illustrate examples of an IC package with stacked compute logic and memory dies as described herein, in accordance with some embodiments.
Figure 4B:
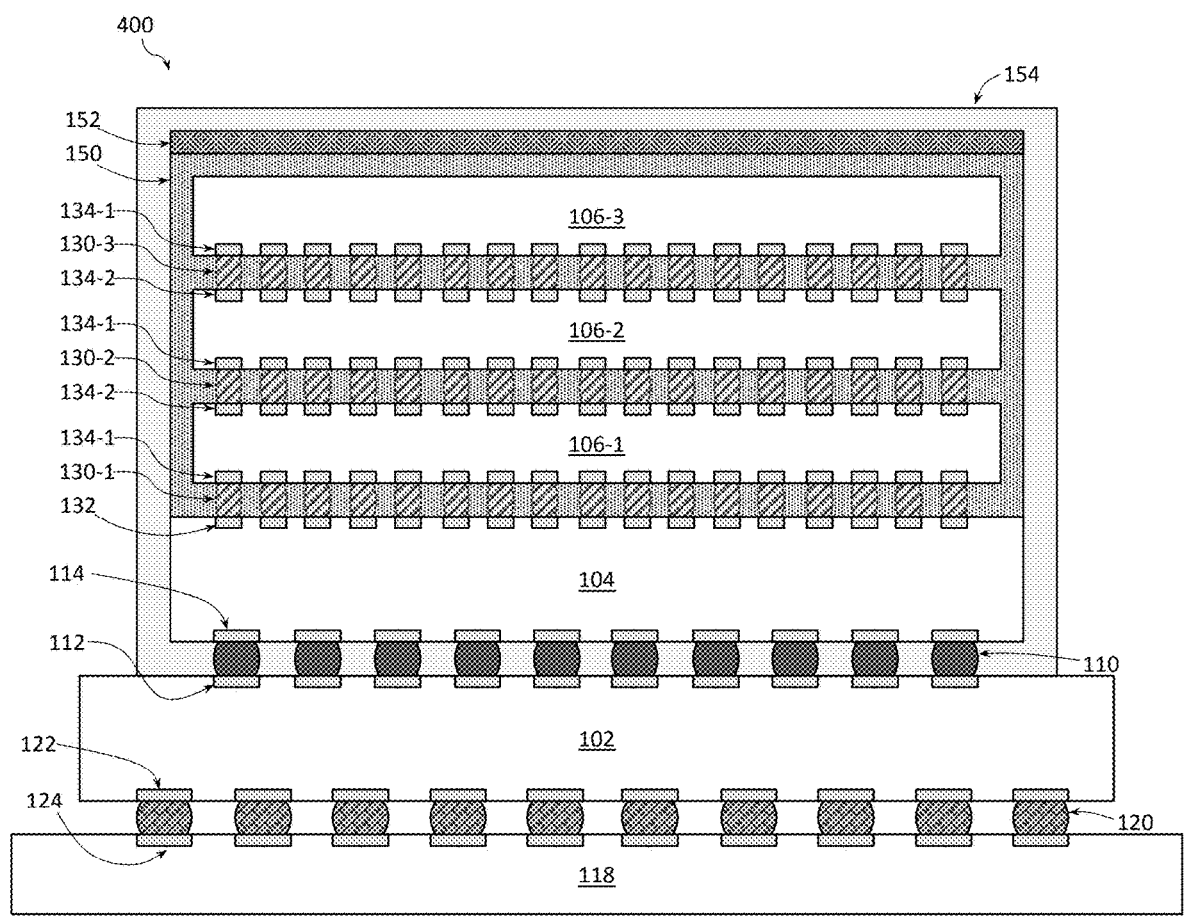
Figure 4C:
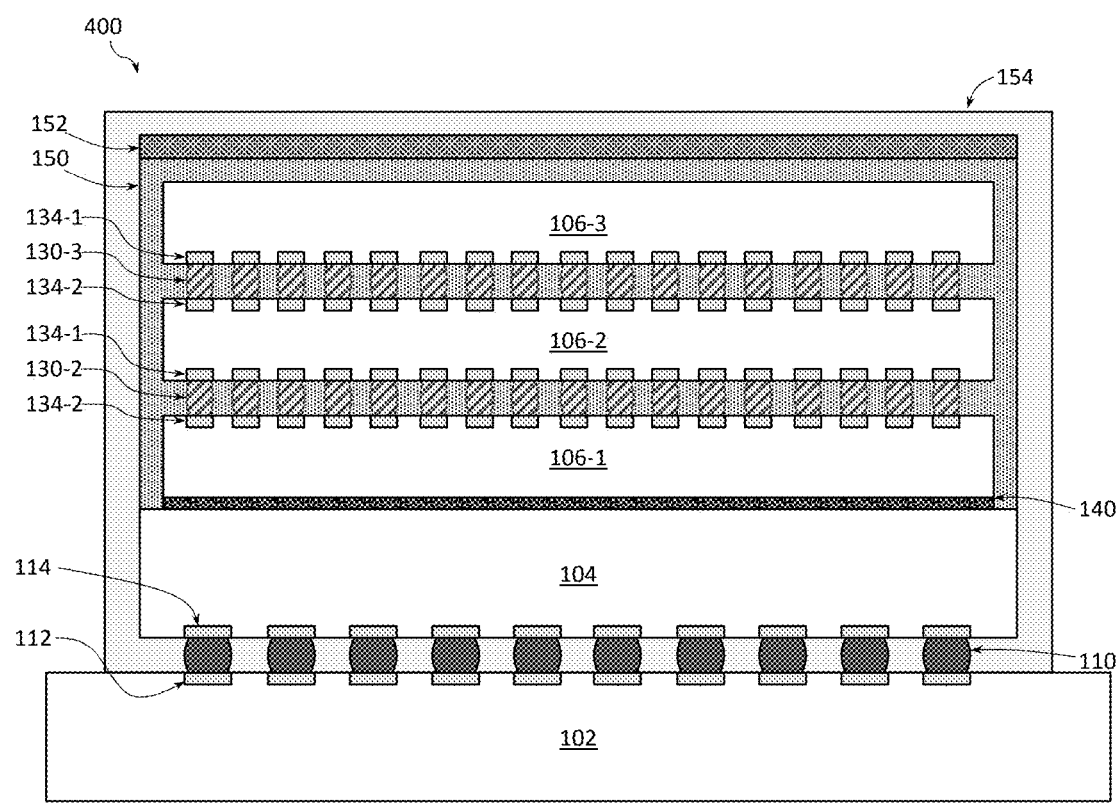

FIGS. 4A-4C illustrate examples of an IC package 400 with stacked compute logic die 104 and memory dies 106 as described herein, in accordance with some embodiments.

As shown in FIG. 4A, the IC package 400 may include a package substrate 102, the compute logic die 104, and two or more memory dies 106 (with the example embodiment shown in FIG. 4 illustrating three memory dies 106, labeled as dies 106-1 through 106-3). The memory dies 106 of the IC package 400 may be implemented as the memory dies 106 described with reference to FIGS. 1-3.

The package substrate 102 may include an insulating material (e.g., a dielectric material formed in multiple layers, as known in the art) and one or more conductive pathways through the dielectric material (e.g., including conductive traces and/or conductive vias, as shown). In some embodiments, the insulating material of the package substrate 102 may be a dielectric material, such as an organic dielectric material, a fire retardant grade 4 material (FR-4), bismaleimide triazine (BT) resin, polyimide materials, glass reinforced epoxy matrix materials, or low-k and ultra-low-k dielectric (e.g., carbon-doped dielectrics, fluorine-doped dielectrics, porous dielectrics, and organic polymeric dielectrics). In particular, when the package substrate 102 is formed using standard PCB processes, the package substrate 102 may include FR-4, and the conductive pathways in the package substrate 102 may be formed by patterned sheets of copper separated by build-up layers of the FR-4. The conductive pathways in the package substrate 102 may be bordered by liner materials, such as adhesion liners and/or barrier liners, as suitable.

In some embodiments, the package substrate 102 may be a lower density medium and any of the dies 104, 106 may be a higher density medium. As used herein, the term "lower density" and "higher density" are relative terms indicating that the conductive pathways (e.g., including conductive lines and conductive vias) in a lower density medium are larger and/or have a greater pitch than the conductive pathways in a higher density medium. In some embodiments, a higher density medium may be manufactured using a modified semi-additive process or a semi-additive build-up process with advanced lithography (with small vertical interconnect features formed by advanced laser or lithography processes), while a lower density medium may be a PCB manufactured using a standard PCB process (e.g., a standard subtractive process using etch chemistry to remove areas of unwanted copper, and with coarse vertical interconnect features formed by a standard laser process).

Additional passive components, such as surface-mount resistors, capacitors, and/or inductors, may be disposed on the top surface or the bottom surface of the package substrate 102, or embedded in the package substrate 102.

The elements of the IC package 400 may have any suitable dimensions. For example, in some embodiments, a thickness 126 (labeled in FIG. 4A) of the package substrate 102 may be between about 0.1 millimeters and 1.4 millimeters (e.g., between about 0.1 millimeters and 0.35 millimeters, between about 0.25 millimeters and 0.8 millimeters, or approximately 1 millimeter). In another example, in some embodiments, one of the dies 104, 106 may have a smaller footprint than the other, e.g., shown in the example of FIG. 4A with the memory dies 106 being narrower than the compute logic die 104. Although the memory dies 106 are shown in FIG. 4A to be aligned with one another on their left and right sides, there does not have to be such alignment in other embodiments of the IC package 400.

As shown in FIG. 4A, the package substrate 102 may be coupled to the compute logic die 104 by DTPS interconnects 110. In particular, the top surface of the package substrate 102 may include a set of conductive contacts 112, and the bottom surface of the compute logic die 104 may include a set of conductive contacts 114. The conductive contacts 114 at the bottom surface of the compute logic die 104 may be electrically and mechanically coupled to the conductive contacts 112 at the top surface of the package substrate 102 by the DTPS interconnects 110.

As further shown in FIG. 4A, the compute logic die 104 may be coupled to the first memory die 106-1 by DTD interconnects 130-1. In particular, the top surface of the compute logic die 104 may include a set of conductive contacts 132, and the bottom surface of the first memory die 106-1 may include a set of conductive contacts 134-1. The conductive contacts 134-1 at the bottom surface of the first memory die 106-1 may be electrically and mechanically coupled to the conductive contacts 132 at the top surface of the compute logic die 104 by the DTD interconnects 130-1. As also shown in FIG. 4A, the top surface of the first memory die 106-1 may include a set of conductive contacts 134-2, and other memory dies 106 may also include a set of conductive contacts 134-1 at the bottom surface and a set of conductive contacts 134-2 at the top surface, as needed. For example, as shown in FIG. 4A, the second memory die 106-2 may be coupled to the first memory die 106-1 by DTD interconnects 130-2, where the conductive contacts 134-1 at the bottom surface of the second memory die 106-2 may be electrically and mechanically coupled to the conductive contacts 134-2 at the top surface of the first memory die 106-1 by the DTD interconnects 130-2. In another example, as shown in FIG. 4A, the third memory die 106-3 may be coupled to the second memory die 106-2 by DTD interconnects 130-3, where the conductive contacts 134-1 at the bottom surface of the third memory die 106-3 may be electrically and mechanically coupled to the conductive contacts 134-2 at the top surface of the second memory die 106-2 by the DTD interconnects 130-3. The conductive contacts 112, 114, 132, and 134 (e.g., 134-1 and 134-2) may include bond pads, posts, or any other suitable conductive contacts, for example.

In some embodiments, the pitch of the DTD interconnects 130 may be different from the pitch of the DTPS interconnects 110, although, in other embodiments, these pitches may be substantially the same. In various embodiments, the pitches of the DTD interconnects 130 between different pairs of adjacent memory dies 106 may be different.

The DTPS interconnects disclosed herein (e.g., the DTPS interconnects 110) may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein (e.g., any of the DTD interconnects 130) may take any suitable form. In some embodiments, some or all of the DTD interconnects as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some embodiments, a thin cap of solder may be used in a metal-to-metal interconnect to accommodate planarity, and this solder may become an intermetallic compound during processing. In some metal-to-metal interconnects that utilize hybrid bonding, a dielectric material (e.g., silicon oxide, silicon nitride, silicon carbide, or an organic layer) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be unpackaged dies, and/or the DTD interconnects may include small conductive bumps or pillars (e.g., copper bumps or pillars) attached to the respective conductive contacts by solder. In some embodiments, some or all of the DTD interconnects in an IC assembly as described herein (e.g., any embodiments of the IC assembly 100) or an IC package as described herein (e.g., any embodiments of the IC package 400) may be solder interconnects that include a solder with a higher melting point than a solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth) or tin, silver, and bismuth. In some embodiments, a lower-temperature solder may include indium, indium and tin, or gallium.

In some embodiments, a set of DTD interconnects may include solder. DTD interconnects that include solder may include any appropriate solder material, such as any of the materials discussed above for the DTPS interconnects. In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In IC assemblies or IC packages as described herein, some or all of the DTD interconnects may have a finer pitch than the DTPS interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the IC assemblies or IC packages as described herein may be formed larger and farther apart than DTD interconnects, which may experience less thermal stress due to the greater material similarity of the pair of dies on either side of the DTD interconnects. In some embodiments, the DTPS interconnects disclosed herein may have a pitch between about 80 micron and 300 micron, while the DTD interconnects disclosed herein may have a pitch between about 0.5 micron and 100 micron.

FIG. 4A further illustrates that, in some embodiments, the IC package 400 may include one or more of a mold material 150, a thermal interface material (TIM) 152, and a heat spreader 154 (i.e., in other embodiments of the IC package 400, one or more of the mold material 150, the TIM 152, and the heat spreader 154 may be absent).

The mold material 150 may extend around one or more of the dies 104, 106 over the package substrate 102. In some embodiments, the mold material 150 may extend above one or more of the dies 104, 106 on the package substrate 102. In some embodiments, the mold material 150 may extend between one or more of the dies 104, 106 and the package substrate 102 around the associated DTPS interconnects 110. In such embodiments, the mold material 150 may serve as an underfill material. In some embodiments, the mold material 150 may extend between different ones of the dies 104, 106 around the associated DTD interconnects 130. In such embodiments, the mold material 150 may serve as an underfill material. The mold material 150 may include multiple different mold materials (e.g., an underfill material, and a different overmold material). The mold material 150 may be an insulating material, such as an appropriate epoxy material. In some embodiments, the mold material 150 may include an underfill material that is an epoxy flux that assists with soldering the compute logic die 104-1 to the package substrate 102 when forming the DTPS interconnects 110, and then polymerizes and encapsulates the DTPS interconnects 110. The mold material 150 may be selected to have a coefficient of thermal expansion (CTE) that may mitigate or minimize the stress between the dies 104, 106 and the package substrate 102 arising from uneven thermal expansion in the IC package 400. In some embodiments, the CTE of the mold material 150 may have a value that is intermediate to the CTE of the package substrate 102 (e.g., the CTE of the dielectric material of the package substrate 102) and a CTE of the dies 104, 106.

The TIM 152 may include a thermally conductive material (e.g., metal particles) in a polymer or other binder. The TIM 152 may be a thermal interface material paste or a thermally conductive epoxy (which may be a fluid when applied and may harden upon curing, as known in the art). The TIM 152 may provide a path for heat generated by the dies 104, 106 to readily flow to the heat spreader 154, where it may be spread and/or dissipated. Some embodiments of the IC package 400 of FIG. 4A may include a sputtered backside metallization (not shown) across the mold material 150 and the dies 104, 106. In such embodiments, the TIM 152 (e.g., a solder TIM) may be disposed on this backside metallization.

The heat spreader 154 may be used to move heat away from the dies 104, 106 (e.g., so that the heat may be more readily dissipated by a heat sink or other thermal management device). The heat spreader 154 may include any suitable thermally conductive material (e.g., metal, appropriate ceramics, etc.), and may include any suitable features (e.g., fins). In some embodiments, the heat spreader 154 may be an integrated heat spreader.

FIG. 4B illustrates that, in some embodiments, the IC package 400 may also include a circuit board 118. The package substrate 102 may be coupled to the circuit board 118 by second-level interconnects 120 at the bottom surface of the package substrate 102. In particular, the package substrate 102 may include conductive contacts 122 at its bottom surface, and the circuit board 118 may include conductive contacts 124 at its top surface. The second-level interconnects 120 may electrically and mechanically couple the conductive contacts 124 and the conductive contacts 122. The second-level interconnects 120 illustrated in FIG. 4B are shown to represent solder balls (e.g., for a ball grid array arrangement), but any suitable second-level interconnects 120 may be used (e.g., pins in a pin grid array arrangement or lands in a land grid array arrangement) in other embodiments of the IC package 400. The circuit board 118 may be a motherboard, for example, and may have other components attached to it (not shown). The circuit board 118 may include conductive pathways and other conductive contacts (not shown) for routing power, ground, and signals through the circuit board 118, as known in the art. In some embodiments, the second-level interconnects 120 may not couple the package substrate 102 to a circuit board 118 but may instead couple the package substrate 102 to another IC package, an interposer, or any other suitable component. The conductive contacts 122, 124 may include bond pads, posts, or any other suitable conductive contacts, for example.

In some embodiments, one or more of the conductive pathways in the package substrate 102 may extend between one or more conductive contacts 112 at the top surface of the package substrate 102 and one or more conductive contacts 122 at the bottom surface of the package substrate 102. In some embodiments, one or more of the conductive pathways in the package substrate 102 may extend between different conductive contacts 112 at the top surface of the package substrate 102. In some embodiments, one or more of the conductive pathways in the package substrate 102 may extend between different conductive contacts 122 at the bottom surface of the package substrate 102. The rest of the descriptions provided with respect to FIG. 4A are applicable to, and may be combined with, the embodiment of FIG. 4B (and vice versa), and, therefore, in the interests of brevity, are not repeated.

In some embodiments, the IC package 400 may include at least two dies 104, 106 that are hybrid bonded. This is illustrated in FIG. 4C with the compute logic die 104-1 being hybrid bonded to the first memory die 106-2 with a bonding material/interface 140 therebetween. To that end, in some embodiments, a bonding material may be applied to the one or both faces of the dies 104, 106 that should be bonded and then the dies are brought together, possibly while applying a suitable pressure and heating up the assembly to a suitable temperature (e.g., to moderately high temperatures, e.g., between about 50 and 200 degrees Celsius) for a duration of time. In some embodiments, the bonding material may be an adhesive material that ensures attachment of the dies to one another. In some embodiments, the bonding material may be an etch-stop material. In some embodiments, the bonding material may be both an etch-stop material and have suitable adhesive properties to ensure attachment of the dies to one another. In some embodiments, the bonding material may include silicon, nitrogen, and carbon, where the atomic percentage of any of these materials may be at least 1%, e.g., between about 1% and 50%, indicating that these elements are added deliberately, as opposed to being accidental impurities which are typically in concentration below about 0.1%. Having both nitrogen and carbon in these concentrations, in addition to silicon, is not typically used in conventional semiconductor manufacturing processes where, typically, in an individual die, either nitrogen or carbon is used in combination with silicon, and, therefore, could be a characteristic feature of the hybrid bonding of two dies. Using an etch-stop material at the interface (i.e., the interface between the first and second IC structures) that includes include silicon, nitrogen, and carbon, where the atomic percentage of any of these materials may be at least 1%, e.g., SiOCN, may be advantageous in terms that such a material may act both as an etch-stop material, and have sufficient adhesive properties to bond the dies together. In addition, an etch-stop material at the interface between the dies that includes include silicon, nitrogen, and carbon, where the atomic percentage of any of these materials may be at least 1%, may be advantageous in terms of improving etch-selectivity of this material with respect to etch-stop materials that may be used in different dies.

In some embodiments, no bonding material may be used during hybrid bonding of any pairs of the dies 104, 106, but there will still be a bonding interface resulting from the bonding of the dies to one another. Thus, in such embodiments, the reference numeral 140 shown in FIG. 4C refers to a bonding interface. Such a bonding interface may be recognizable as a seam or a thin layer in the microelectronic assembly, using, e.g., selective area diffraction (SED), even when the specific materials of the insulators of the dies that are bonded together may be the same, in which case the bonding interface would still be noticeable as a seam or a thin layer in what otherwise appears as a bulk insulator (e.g., bulk oxide) layer.

In other embodiments of the IC assembly 400, the bonding material/interface 140 may be between any other pairs of adjacent dies 104, 106, additionally or alternatively to the embodiment shown in FIG. 4C.

In some embodiments, the IC package 400 may be a flip chip package, although other package architectures may be used. In some embodiments, the IC package 400 may be a ball grid array (BGA) package, such as an embedded wafer-level ball grid array (eWLB) package. In another example, the IC package 400 may be a wafer-level chip scale package (WLCSP) or a panel fan-out (FO) package. Although one compute logic die 104 and three memory dies 106 are illustrated in the IC package 400 of FIG. 4, an IC package 400 may include any desired number of the dies 104, 106.

Figure 5:
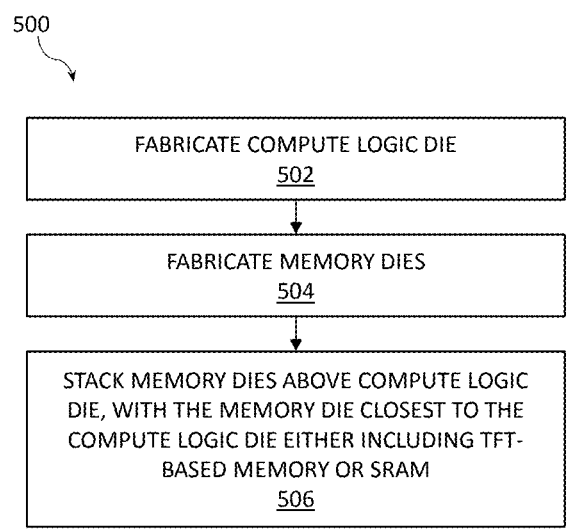
FIG. 5 is a flow diagram of an illustrative method of manufacturing an IC assembly with stacked compute logic and memory dies, according to some embodiments of the present disclosure.

Any suitable techniques may be used to manufacture an IC assembly with stacked compute logic and memory dies as disclosed herein. FIG. 5 is a flow diagram of an example method 500 of manufacturing an IC assembly with stacked compute logic and memory dies, according to some embodiments of the present disclosure. Although the operations discussed below with reference to the method 500 are illustrated in a particular order and depicted once each, these operations may be repeated or performed in a different order (e.g., in parallel), as suitable. Additionally, various operations may be omitted, as suitable. Various operations of the method 500 may be illustrated with reference to one or more of the embodiments discussed above, but the method 500 may be used to manufacture any suitable IC assembly with stacked compute logic and memory dies (including any suitable ones of the embodiments disclosed herein). The example fabrication method shown in FIG. 5 may include other operations not specifically shown in FIG. 5, such as various cleaning or planarization operations as known in the art. For example, in some embodiments, any of the layers of the IC assembly may be cleaned prior to, after, or during any of the processes of the fabrication method described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the top surfaces of the dies described herein may be planarized prior to, after, or during any of the processes of the fabrication method described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

As shown in FIG. 5, the method 500 may include a process 502 that includes fabricating a compute logic die (e.g., the compute logic die 104) and a process 504 that includes fabricating memory dies (e.g., the memory dies 106). In various embodiments, order of the processes 502 and 504 may be reversed compared to what is shown in FIG. 5, and/or at least portions of these processes may be performed substantially simultaneously. The processes 502 and 504 may include various deposition and patterning techniques as known in the art to form the logic transistors and the memory cells as described herein. As used herein, "patterning" may refer to forming a pattern in one or more materials using any suitable techniques (e.g., applying a resist, patterning the resist using lithography, and then etching the one or more material using dry etching, wet etching, or any appropriate technique).

As further shown in FIG. 5, the method 500 may also include a process 506 that includes stacking the memory dies fabricated in the process 504 over the compute logic die fabricated in the process 502, with the memory die being closes to the compute logic die either including TFT-based memory (e.g., as described with reference to FIG. 1) or SRAM (e.g., as described with reference to FIG. 3). In some embodiments, the process 506 may include providing DTD interconnects or hybrid bonding materials/interfaces as described with reference to FIG. 4.

Figures 6A, 6B:
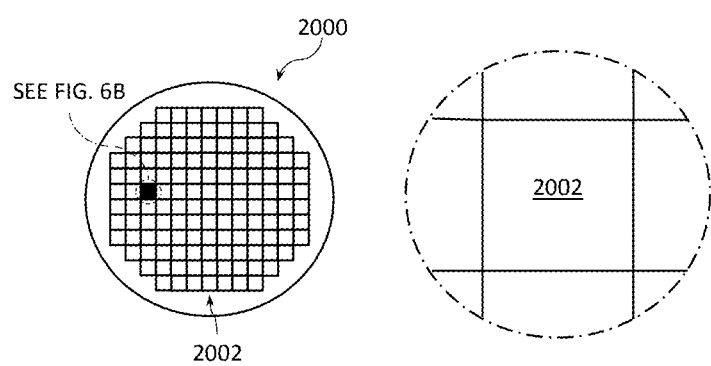
FIGS. 6A-6B are top views of a wafer and dies that may be used to implement any of the stacked compute logic and memory dies as described herein, in accordance with some embodiments.

FIGS. 6A-6B are top views of a wafer 2000 and dies 2002 that may be used to implement any of the stacked compute logic and memory dies 104, 106 as described herein, in accordance with some embodiments. In some embodiments, the dies 2002 may be included in an IC assembly, in accordance with any of the embodiments disclosed herein. For example, any of the dies 2002 may serve as any of the dies 104, 106 in the IC assembly 100 shown in FIG. 1 or FIG. 3. In some embodiments, the dies 2002 may be included in an IC package, in accordance with any of the embodiments disclosed herein. For example, any of the dies 2002 may serve as any of the dies 104, 106 in the IC package 400 shown in FIG. 4. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including logic transistors and/or memory cells as described herein). After the fabrication of the semiconductor product is complete (e.g., after manufacture of any of the dies 104, 106 as described herein), the wafer 2000 may undergo a singulation process in which each of the dies 2002 is separated from one another to provide discrete "chips" of the semiconductor product. In particular, any of the dies 104, 106 as disclosed herein may take the form of the wafer 2000 (e.g., not singulated) or the form of the die 2002 (e.g., singulated). The die 2002 may include one or more transistors (e.g., logic transistors and/or access transistors of memory cells, as described herein), one or more memory arrays (e.g., memory arrays with the memory cells as described herein), and/or supporting circuitry (e.g., one or more interconnects) to route electrical signals to the transistors and/or the memory cells, as well as any other IC components. In some embodiments, the wafer 2000 or the die 2002 may implement or include a memory device, a logic device (e.g., an AND, OR, NAND, or NOR gate), or any other suitable circuit element. Multiple ones of these devices may be combined on a single die 2002. For example, a memory array formed by multiple memory cells in a given layer may be formed on a same die 2002 as a processing device (e.g., the processing device 2402 of FIG. 8) or other logic that is configured to store information in the memory devices or execute instructions stored in the memory array.

Figure 7:
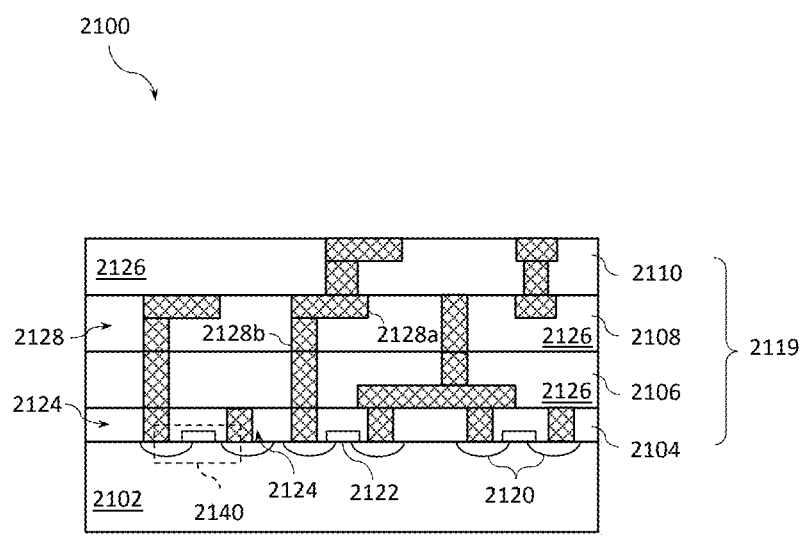
FIG. 7 is a cross-sectional side view of one side of an IC device that may be included in any of the stacked compute logic and memory dies as described herein, in accordance with some embodiments.

FIG. 7 is a cross-sectional side view of one side of an IC device 2100 that may be included in any of the stacked compute logic and memory dies as described herein, in accordance with some embodiments. For example, the IC device 2100 may be, or may be included in any of the dies 104, 106, described above. In particular, the IC device 2100 may include logic transistors and/or memory cells as described herein. Because there are various possibilities where such logic transistors and/or memory cells may be integrated in the IC device 2100, the logic transistors and/or memory cells are not specifically shown in FIG. 7. In some embodiments, the IC device 2100 may be included in, or serve as, the die 2002.

As shown in FIG. 12, the IC device 2100 may be formed on a substrate 2102 (e.g., the wafer 2000 of FIG. 6A) and may be included in a die (e.g., the die 2002 of FIG. 6B). The substrate 2102 may include any material that may serve as a foundation for an IC device 2100. The substrate 2102 may be a semiconductor substrate and may include any of the examples described above. Although a few examples of the substrate 2102 are described here, any material or structure that may serve as a foundation upon which an IC device 2100 may be built falls within the spirit and scope of the present disclosure. The substrate 2102 may be part of a singulated die (e.g., the die 2002 of FIG. 6B) or a wafer (e.g., the wafer 2000 of FIG. 6A).

The IC device 2100 may include one or more device layers 2104 disposed on the substrate 2102. The device layers 2104 provide one example of one or more layers with the logic devices (e.g., frontend transistors) of the FEOL layer. The device layer 2104 may include features of one or more transistors 2140 (e.g., metal-oxide-semiconductor field-effect transistors (MOSFETs)) formed on the substrate 2102. The device layer 2104 may include, for example, one or more S/D regions 2120, a gate 2122 to control current flow in the transistors 2140 between the S/D regions 2120, and one or more S/D contacts 2124 to route electrical signals to/from the S/D regions 2120. The transistors 2140 may include additional features not depicted for the sake of clarity, such as device isolation regions, gate contacts, and the like.

Each transistor 2140 may include a gate 2122 formed of at least two layers, a gate dielectric layer and a gate electrode layer. Generally, the gate dielectric layer of a transistor 2140 may include one layer or a stack of layers. In various embodiments, the gate dielectric of the gate 2122 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric to improve the quality of the gate dielectric. In some embodiments, the gate dielectric may have a thickness between about 0.5 nanometers and 3 nanometers, including all values and ranges therein, e.g., between about 1 and 3 nanometers, or between about 1 and 2 nanometers.

In some embodiments, the gate dielectric may be a multilayer gate dielectric, e.g., it may include any of the high-k dielectric materials in one layer and a layer of IGZO. In some embodiments, a gate stack (i.e., a combination of the gate dielectric and the gate electrode of the transistor 2140) may be arranged so that the IGZO is disposed between the high-k dielectric and the channel material of the transistor 2140. In such embodiments, the IGZO may be in contact with the channel material, and may provide the interface between the channel material and the remainder of the multilayer gate dielectric. The IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10).

The gate electrode of the gate 2122 may be formed on the gate dielectric and may include at least one P-type work function metal or N-type work function metal, depending on whether the transistor 2140 is to be a PMOS or an NMOS transistor. For a PMOS transistor, metals that may be used for the gate electrode of the gate 2122 may include, but are not limited to, ruthenium, palladium, platinum, cobalt, nickel, and conductive metal oxides (e.g., ruthenium oxide). For an NMOS transistor, metals that may be used for the gate electrode of the gate 2122 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some implementations, the gate electrode may include a stack of two or more metal layers, where one or more metal layers are work function metal layers and at least one metal layer is a fill metal layer. Further metal layers may be included for other purposes, such as a barrier layer.

In some embodiments, when viewed as a cross-section of the transistor 2140 along the source-channel-drain direction, the gate electrode of the gate 2122 may include a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a FinFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2120 may be formed within the substrate 2102, e.g., adjacent to the gate of each transistor 2140. The S/D regions 2120 may be formed using an implantation/diffusion process or an etching/deposition process, for example. In the former process, dopants such as boron, aluminum, antimony, phosphorous, or arsenic may be ion-implanted into the substrate 2102 to form the S/D regions 2120. An annealing process that activates the dopants and causes them to diffuse farther into the substrate 2102 may follow the ion-implantation process. In the latter process, the substrate 2102 may first be etched to form recesses at the locations of the S/D regions 2120. An epitaxial deposition process may then be carried out to fill the recesses with material that is used to fabricate the S/D regions 2120. In some implementations, the S/D regions 2120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2120 may be formed using one or more alternate semiconductor materials such as germanium or a group III-V material or alloy. In further embodiments, one or more layers of metal and/or metal alloys may be used to form the S/D regions 2120.

Various transistors 2140 are not limited to the type and configuration depicted in FIG. 7 and may include a wide variety of other types and configurations such as, for example, planar transistors, non-planar transistors (e.g., FinFETs, nanowire, or nanoribbon transistors), or any suitable combination of transistors.

Electrical signals, such as power and/or input/output (I/O) signals, may be routed to and/or from the transistors 2140 of the device layer 2104 through one or more interconnect layers disposed on the device layer 2104 (illustrated in FIG. 7 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110. The one or more interconnect layers 2106-2110 may form an interlayer dielectric (ILD) stack 2119 of the IC device 2100.

The interconnect structures 2128 may be arranged within the interconnect layers 2106-1210 to route electrical signals according to a wide variety of designs (in particular, the arrangement is not limited to the particular configuration of interconnect structures 2128 depicted in FIG. 7). Although a particular number of interconnect layers 2106-1210 is depicted in FIG. 7, embodiments of the present disclosure include IC devices having more or fewer interconnect layers than depicted.

In some embodiments, the interconnect structures 2128 may include trench structures 2128a (sometimes referred to as "lines") and/or via structures 2128B (sometimes referred to as "holes") filled with an electrically conductive material such as a metal. The trench structures 2128a may be arranged to route electrical signals in a direction of a plane that is substantially parallel with a surface of the substrate 2102 upon which the device layer 2104 is formed. For example, the trench structures 2128a may route electrical signals in a direction in and out of the page from the perspective of FIG. 7. The via structures 2128B may be arranged to route electrical signals in a direction of a plane that is substantially perpendicular to the surface of the substrate 2102 upon which the device layer 2104 is formed. In some embodiments, the via structures 2128B may electrically couple trench structures 2128a of different interconnect layers 2106-2110 together.

The interconnect layers 2106-2110 may include a dielectric material 2126 disposed between the interconnect structures 2128, as shown in FIG. 7. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same. The dielectric material 2126 may include any of the insulator/dielectric materials described above.

A first interconnect layer 2106 (referred to as Metal 1 or "M1") may be formed directly on the device layer 2104. In some embodiments, the first interconnect layer 2106 may include trench structures 2128a and/or via structures 2128B, as shown. The trench structures 2128a of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2128B to couple the trench structures 2128a of the second interconnect layer 2108 with the trench structures 2128a of the first interconnect layer 2106. Although the trench structures 2128a and the via structures 2128B are structurally delineated with a line within each interconnect layer (e.g., within the second interconnect layer 2108) for the sake of clarity, the trench structures 2128a and the via structures 2128B may be structurally and/or materially contiguous (e.g., simultaneously filled during a dual damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

The interconnect layers 2106-2110 may be the metal layers M1-M3, described above. Further metal layers may be present in the IC device 2100, as also described above.

Figure 8:
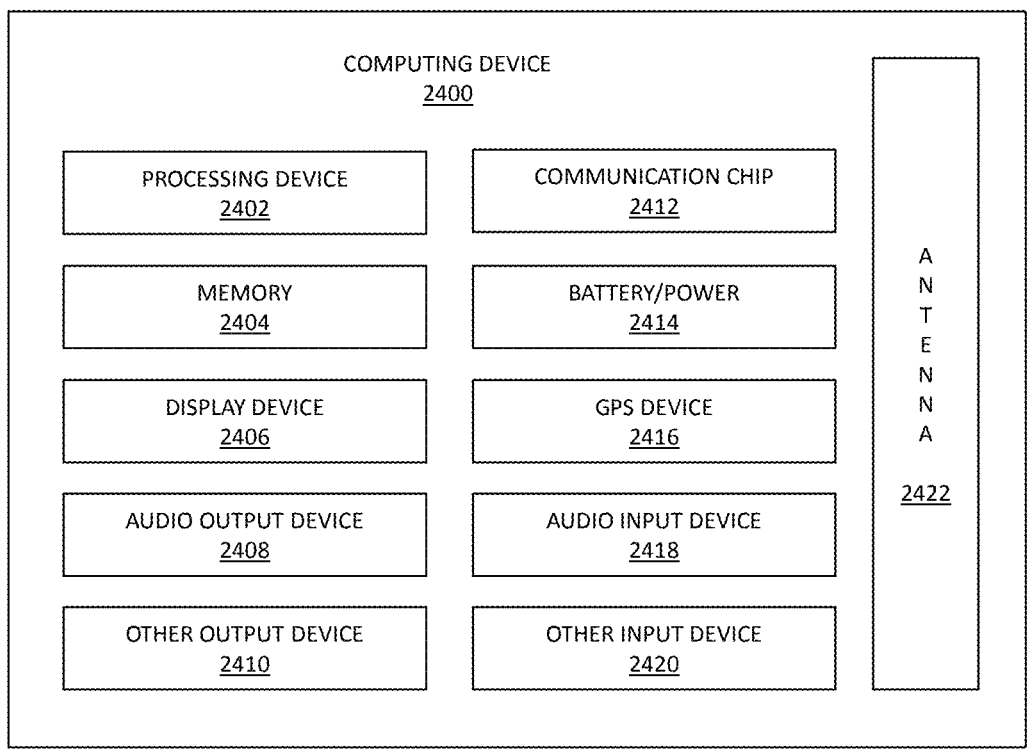
FIG. 8 is a block diagram of an example computing device that may include an IC assembly with stacked compute logic and memory dies as described herein, in accordance with some embodiments.

FIG. 8 is a block diagram of an example computing device 2400 that may include an IC assembly with stacked compute logic and memory dies as described herein, in accordance with some embodiments. For example, any suitable ones of the components of the computing device 2400 may include an IC assembly, e.g., the IC assembly 100 (FIG. 1 or FIG. 3). Any of the components of the computing device 2400 may include an IC device 2100 (FIG. 7) and/or an IC package 400 (FIG. 4).

A number of components are illustrated in FIG. 8 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system-on-chip (SoC) die.

Additionally, in various embodiments, the computing device 2400 may not include one or more of the components illustrated in FIG. 8, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408 but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), CPUs, GPUs, cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory. The memory 2404 may include one or more IC assemblies with stacked compute logic and memory dies as described herein.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 602.11 family), IEEE 602.16 standards (e.g., IEEE 602.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 602.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 602.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

The following paragraphs provide various examples of the embodiments disclosed herein.

Example 1 provides an IC assembly that includes a compute logic die; and a die stack, above the compute logic die and coupled to the compute logic die, the die stack including a first memory die including first memory cells, and a second memory die including second memory cells, where each of the first memory cells and the second memory cells includes a transistor and a storage element, coupled to the transistor. Furthermore, the transistors of the first memory cells are TFTs (i.e., transistors with semiconductor materials of the channel region (i.e., channel materials) being thin-film semiconductor materials), the transistors of the second memory cells are not TFTs (e.g., transistors with channel materials being epitaxially grown semiconductor materials), and the first memory die is between the compute logic die and the second memory die.

Example 2 provides the IC assembly according to example 1, where the storage element is a capacitor, and where each of the first memory cells and the second memory cells is a DRAM cell, e.g., a 1T-1C memory cell.

Example 3 provides the IC assembly according to any one of the preceding examples, where channel regions of the transistors of the first memory cells include a semiconductor material with an average grain size smaller than 0.5 millimeter. For example, the transistors of the first memory cells may include substantially polymorphous semiconductor materials as their channel materials.

Example 4 provides the IC assembly according to any one of the preceding examples, where channel regions of the transistors of the first memory cells include a semiconductor material with an average grain size between 0.5 millimeter and 1 millimeter. For example, the transistors of the first memory cells may include substantially polycrystalline semiconductor materials as their channel materials.

Example 5 provides the IC assembly according to any one of the preceding examples, where channel regions of the transistors of the second memory cells include a semiconductor material with an average grain size greater than 1 millimeter. For example, the transistors of the second memory cells may include a substantially single-crystalline semiconductor materials as their channel materials.

Example 6 provides the IC assembly according to any one of the preceding examples, where channel regions of the transistors of the first memory cells include a first semiconductor material, channel regions of the transistors of the second memory cells include a second semiconductor material, and a bandgap of the first semiconductor material is larger than a bandgap of the second semiconductor material.

Example 7 provides the IC assembly according to any one of the preceding examples, further including DTD interconnects between (and coupling) at least one of the compute logic die and the first memory die, and the first memory die and the second memory die.

Example 8 provides the IC assembly according to any one of the preceding examples, further including a hybrid bonding interface between (and coupling) at least one of the compute logic die and the first memory die, and the first memory die and the second memory die.

Example 9 provides the IC assembly according to any one of the preceding examples, where the compute logic die includes one or more logic transistors coupled to one or more of the first memory cells and the second memory cells.

Example 10 provides the IC assembly according to any one of the preceding examples, where at least one of the first memory cells is an SRAM cell.

Example 11 provides an IC assembly that includes a compute logic die; and a die stack, above the compute logic die and coupled to the compute logic die, the die stack including a first memory die including first memory cells, and a second memory die including second memory cells, where the first memory cells include SRAM cells, the second memory cells include MRAM cells or DRAM cells, and the first memory die is between the compute logic die and the second memory die.

Example 12 provides the IC assembly according to example 11, further including DTD interconnects between (and coupling) at least one of the compute logic die and the first memory die, and the first memory die and the second memory die.

Example 13 provides the IC assembly according to examples 11 or 12, further including a hybrid bonding interface between (and coupling) at least one of the compute logic die and the first memory die, and the first memory die and the second memory die.

Example 14 provides the IC assembly according to any one of examples 11-13, where the compute logic die includes one or more logic transistors coupled to one or more of the first memory cells and the second memory cells.

Example 15 provides the IC assembly according to any one of examples 11-14, where the die stack further includes a third memory die including third memory cells, the second memory die is between the first memory die and the third memory die, the second memory cells include the MRAM cells, and the third memory cells include the DRAM cells.

Example 16 provides the IC assembly according to any one of examples 11-15, where at least one of the first memory cells includes a transistor and a storage element, coupled to the transistor, where the transistor is a TFT.

Example 17 provides an IC package that includes an IC assembly according to any one of the preceding examples; and a further IC component, coupled to the IC device.

Example 18 provides the IC package according to example 17, further including interconnects to couple the further IC component and the IC assembly.

Example 19 provides the IC package according to examples 17 or 18, where the first component or the second component includes one of a package substrate, an interposer, or a further IC die.

Example 20 provides the IC package according to any one of examples 17-19, where the IC assembly includes, or is a part of, at least one of a memory device, a computing device, a wearable device, a handheld electronic device, and a wireless communications device.

Example 21 provides an electronic device that includes a carrier substrate; and one or more of the IC assembly according to any one of the preceding examples and the IC package according to any one of the preceding examples, coupled to the carrier substrate.

Example 22 provides the electronic device according to example 21, where the carrier substrate is a motherboard.

Example 23 provides the electronic device according to example 21, where the carrier substrate is a PCB.

Example 24 provides the electronic device according to any one of examples 21-23, where the electronic device is a wearable electronic device (e.g., a smart watch) or handheld electronic device (e.g., a mobile phone).

Example 25 provides the electronic device according to any one of examples 21-24, where the electronic device further includes one or more communication chips and an antenna.

Example 26 provides the electronic device according to any one of examples 21-25, where the electronic device is a radio frequency (RF) transceiver.

Example 27 provides the electronic device according to any one of examples 21-25, where the electronic device is one of a switch, a power amplifier, a low-noise amplifier, a filter, a filter bank, a duplexer, an upconverter, or a downconverter of an RF communications device, e.g., of an RF transceiver.

Example 28 provides the electronic device according to any one of examples 21-25, where the electronic device is a computing device.

Example 29 provides the electronic device according to any one of examples 21-28, where the electronic device is included in a base station of a wireless communication system.

Example 30 provides the electronic device according to any one of examples 21-28, where the electronic device is included in a user equipment device (i.e., a mobile device) of a wireless communication system.

Example 31 provides a method of fabricating an IC assembly. The method includes obtaining (e.g., fabricating or obtaining from a third party) a compute logic die that includes logic transistors; obtaining (e.g., fabricating or obtaining from a third party) a first memory die that includes first memory cells and a second memory die that includes second memory cells; stacking the first memory die over the compute logic die, with first interconnects coupling one or more of the logic transistors and one or more of the first memory cells; and stacking the second memory die over the first memory die, with second interconnects coupling one or more of the second memory cells and one or more of the first memory cells or one or more of the logic transistors.

Example 32 provides the method according to example 31, wherein one or more of the first interconnects or one or more of the second interconnects include DTD interconnects.

Example 33 provides the method according to examples 31 or 32, wherein one or more of the first interconnects or one or more of the second interconnects include hybrid bonding interconnects.

Example 34 provides the method according to any one of examples 31-33, where the first memory cells are TFT-based memory cells and the second memory cells are non-TFT-based memory cells, or the first memory cells are SRAM cells and the second memory cells are MRAM cells or DRAM cells.

Example 35 provides the method according to any one of examples 31-34, further including processes for forming the IC assembly according to any one of the preceding examples (e.g., for forming the IC assembly according to any one of examples 1-16).

Example 36 provides the method according to any one of examples 31-35, further including processes for forming the IC package according to any one of the preceding examples (e.g., for forming the IC package according to any one of examples 17-20).

Example 37 provides the method according to any one of examples 31-36, further including processes for forming the electronic device according to any one of the preceding examples (e.g., for forming the electronic device according to any one of examples 21-30).

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) assembly, comprising:
    a compute logic die; and
    a die stack, coupled to the compute logic die, the die stack comprising a first memory die including first memory cells, and a second memory die including second memory cells,
    wherein:
        each of the first memory cells and the second memory cells includes a transistor and a storage element, coupled to the transistor,
        the transistors of the first memory cells is a thin-film transistors (TFTs),
        the transistors of the second memory cells is not a TFTs, and
        the first memory die is between the compute logic die and the second memory die.

2. The IC assembly according to claim 1, wherein the storage element is a capacitor, and wherein each of the first memory cells and the second memory cells is a dynamic random-access memory (DRAM) cell.

3. The IC assembly according to claim 1, wherein channel regions of the transistors of the first memory cells include a semiconductor material with an average grain size smaller than 0.5 millimeter.

4. The IC assembly according to claim 1, wherein channel regions of the transistors of the first memory cells include a semiconductor material with an average grain size between 0.5 millimeter and 1 millimeter.

5. The IC assembly according to claim 1, wherein channel regions of the transistors of the second memory cells include a semiconductor material with an average grain size greater than 1 millimeter.

6. The IC assembly according to claim 1, wherein:
    channel regions of the transistors of the first memory cells include a first semiconductor material,
    channel regions of the transistors of the second memory cells include a second semiconductor material, and
    a bandgap of the first semiconductor material is larger than a bandgap of the second semiconductor material.

7. The IC assembly according to claim 1, further comprising die-to-die interconnects between at least one of:
the compute logic die and the first memory die, and
the first memory die and the second memory die.

8. The IC assembly according to claim 1, further comprising a hybrid bonding interface between at least one of:
the compute logic die and the first memory die, and
the first memory die and the second memory die.

9. The IC assembly according to claim 1, wherein the compute logic die includes one or more logic transistors coupled to one or more of the first memory cells and the second memory cells.

10. The IC assembly according to claim 1, wherein at least one of the first memory cells is a static random-access memory (SRAM) cell.

11. An integrated circuit (IC) assembly, comprising:
a compute logic die; and
a die stack, coupled to the compute logic die, the die stack comprising a first memory die including first memory cells, and a second memory die including second memory cells,
wherein:
the first memory cells include static random-access memory (SRAM) cells,
the second memory cells include magnetoresistive random-access memory (MRAM) cells or dynamic random-access memory (DRAM) cells, and
the first memory die is between the compute logic die and the second memory die.

12. The IC assembly according to claim 11, further comprising die-to-die interconnects between at least one of:
the compute logic die and the first memory die, and
the first memory die and the second memory die.

13. The IC assembly according to claim 11, further comprising a hybrid bonding interface between at least one of:
the compute logic die and the first memory die, and
the first memory die and the second memory die.

14. The IC assembly according to claim 11, wherein the compute logic die includes one or more logic transistors coupled to one or more of the first memory cells and the second memory cells.

15. The IC assembly according to claim 11, wherein:
the die stack further includes a third memory die including third memory cells,
the second memory die is between the first memory die and the third memory die,
the second memory cells include the MRAM cells, and
the third memory cells include the DRAM cells.

16. The IC assembly according to claim 11, wherein at least one of the first memory cells includes a transistor and a storage element, coupled to the transistor, where the transistor is a thin-film transistor (TFT).

17. A method of fabricating an integrated circuit (IC) assembly, the method comprising:
providing a compute logic die; and
providing a die stack, coupled to the compute logic die, the die stack comprising a first memory die including first memory cells, and a second memory die including second memory cells,
wherein:
each of the first memory cells and the second memory cells includes a transistor and a storage element, coupled to the transistor,
the transistor of the first memory cells is a thin-film transistor (TFT),
the transistor of the second memory cells is not a TFT, and
the first memory die is between the compute logic die and the second memory die.

18. The method according to claim 17, further comprising providing die-to-die interconnects between at least one of:
the compute logic die and the first memory die, and
the first memory die and the second memory die.

19. The method according to claim 17, further comprising providing hybrid bonding interface between at least one of:
the compute logic die and the first memory die, and
the first memory die and the second memory die.

20. The method according to claim 17, wherein:
the first memory cells are static random-access memory (SRAM) cells and the second memory cells are magnetoresistive random-access memory (MRAM) cells or dynamic random-access memory (DRAM) cells.

* * * * *

UNITED STATES PATENT AND TRADEMARK OFFICE
CERTIFICATE OF CORRECTION

| | | |
|---|---|---|
| PATENT NO. | : 12,374,666 B2 | Page 1 of 1 |
| APPLICATION NO. | : 17/382575 | |
| DATED | : July 29, 2025 | |
| INVENTOR(S) | : Prashant Majhi et al. | |

It is certified that error appears in the above-identified patent and that said Letters Patent is hereby corrected as shown below:

In the Claims

In Column 28, Claim 1, Line 39, delete "transistors" and insert -- transistor --, therefor.

In Column 28, Claim 1, Line 40, delete "transistors (TFTs)," and insert -- transistor (TFT), --, therefor.

In Column 28, Claim 1, Line 41, delete "transistors" and insert -- transistor --, therefor.

In Column 28, Claim 1, Line 42, delete "TFTs," and insert -- TFT, --, therefor.

In Column 28, Claim 3, Line 50, delete "transistors" and insert -- transistor --, therefor.

In Column 28, Claim 4, Line 54, delete "transistors" and insert -- transistor --, therefor.

In Column 28, Claim 5, Line 58, delete "transistors" and insert -- transistor --, therefor.

In Column 28, Claim 6, Line 62, delete "transistors" and insert -- transistor --, therefor.

In Column 28, Claim 6, Line 64, delete "transistors" and insert -- transistor --, therefor.

Signed and Sealed this
Sixteenth Day of September, 2025

Coke Morgan Stewart
*Acting Director of the United States Patent and Trademark Office*